United States Patent [19]

Galler

[11] Patent Number: 4,839,832
[45] Date of Patent: Jun. 13, 1989

[54] NEGATIVE RESISTANCE DEVICE LOCAL EXTREMUM SEEKING CIRCUIT

[75] Inventor: Francis A. Galler, Norfolk, Mass.

[73] Assignee: The Charles Stark Draper Laboratory, Inc., Cambridge, Mass.

[21] Appl. No.: 167,874

[22] Filed: Mar. 14, 1988

[51] Int. Cl.$^4$ .................. G06F 15/20; G06F 15/50
[52] U.S. Cl. ........................ 364/552; 331/107 R; 364/480; 364/571.01
[58] Field of Search ......... 324/73 R, 73 AT, 83 FE, 324/103 P, 103 R; 307/461, 502, 566; 364/480–483, 550, 556, 571.01, 552; 331/96, 101, 105, 107 R; 357/57

[56] References Cited

U.S. PATENT DOCUMENTS

| | | | |
|---|---|---|---|
| 4,028,637 | 6/1977 | Gewartowski et al. | 331/107 R |
| 4,100,510 | 7/1978 | Reggiani et al. | 331/107 R |
| 4,380,744 | 4/1983 | Kantorowicz | 331/107 R |
| 4,394,660 | 7/1983 | Cohen | 331/107 R |
| 4,728,907 | 3/1988 | Cohen | 331/107 R |
| 4,745,374 | 5/1988 | Nishizawa et al. | 331/107 R |

Primary Examiner—Parshotam S. Lall
Assistant Examiner—Kevin J. Teska
Attorney, Agent, or Firm—Joseph S. Iandiorio; Brian M. Dingman

[57] ABSTRACT

A negative resistance device local extremum seeking circuit including a negative resistance device (NRD) and a biasing device for providing a bias signal to operate the NRD. The output of the NRD is detected by a detector that provides a signal which indicates the position of the bias signal in relation to the peak of the NRD. A bias adjust circuit responsive to the detector adjusts the bias signal toward the peak of the NRD to operate it at the peak.

46 Claims, 6 Drawing Sheets

NEGATIVE RESISTANCE DEVICE LOCAL EXTREMUM SEEKING CIRCUIT

FIELD OF INVENTION

This invention relates to a negative resistance device local extremum seeking circuit and more particularly to such a circuit that detects a superimposed excitation signal to identify a local extremum.

BACKGROUND OF INVENTION

Conventional precision voltage references (PVRs) are typically Zener diodes run in reverse breakdown, where relatively large changes in operating current produce relatively small changes in operating voltage. A significant disadvantage of these traditional PVRs is that they must be very carefully doped to be useful as radiation hard PVRs, which are required components of missile guidance systems.

Negative resistance devices (NRDs), for example tunnel diodes and quantum well devices, have local extrema in their I-V curves which make them excellent candidates for use as PVRs. These NRDs are often very radiation hard without the use of special radiation hardening fabrication techniques. This makes them ideally suited for use as PVRs for missile guidance systems. However, NRDs are inherently unstable around the inflection points (local extrema) in their curve due to the negative resistance characteristics around these operating points. Thus, although well suited for use as radiation hard PVRs, NRDs have inherent problems which have kept them from being developed for use as PVRs in radiation hard missle guidance systems.

Typically, the local extremum of an NRD, whether it be a local current extremum or a local voltage extremum, is found by manually plotting the I-V curve for the device. The NRD is fed a signal with a known voltage or current, and the resulting current or voltage, respectively, is measured. The voltage or current is then increased in very small incremental steps until an inflection point is found. Since these devices have at least two inflection points, one at either end of the negative resistance portion of the curve, this manual measure and plot technique is extremely time consuming, and must be repeated whenever there is drift in the device which causes a shift in the position of a local extremum.

This manual technique cannot be used with PVRs in missile guidance systems because the PVR characteristics change with time, temperature, and radiation. As an example, an NRD device with an extremum in current has a stable voltage at this current extremum. The current at this extreme, however, is not stable. The only way to determine the reference voltage is by determining the location of the current inflection point and not by determining the absolute value of current.

A computerized version of the manual curve plotting technique described above can be used to determine the inflection point of an NRD PVR in a missile guidance system. The weakness of that approach is that the computer must plot many points from a broad region around the NRD PVR inflection point and deal with a very large amount of data. This requires a relatively large amount of circuitry, and is a relatively slow technique.

NRDs are also frequently used as triggering devices. For example, tunnel diodes are used to trigger oscilloscope sweeps on detection of a signal of a predetermined size. Typically, the NRD is biased somewhat below the positive going peak that defines the beginning of the negative resistance region of the NRD. When a signal larger than the difference between the bias level and the peak is sensed, the NRD switches to its second stable state, that is, beyond the negative going peak that defines the end of the negative resistance region. This switching action then triggers an event, such as an oscilloscope sweep or an indication of the detection of a signal of at least a predetermined size.

Although these triggering devices employ NRDs, the NRDs are not used as PVRs. They are merely used as switches. In fact, even if these NRDs could be held at their peaks, they would not be useful as triggers because even an extremely small noise signal would trigger the NRD and thus give a false indication of a significant event.

As a result of the inherent difficulty of "stabilizing" an NRD at its peak so it can be used as a PVR, NRDs have not been developed for use as voltage references. However, because NRDs are extremely radiation hard and peak at useful voltages, typically more than 0.06 volts, they are ideally suited for use as PVRs in missile guidance systems.

SUMMARY OF INVENTION

It is therefore an object of this invention to provide a negative resistance device (NRD) local extremum seeking circuit that automatically seeks a local extremum.

It is a further object of this invention to provide an NRD local extremum seeking circuit that automatically holds the NRD at a local extremum so the NRD can be used as a precision reference device.

It is a further object of this invention to provide an NRD local extremum seeking circuit that can be used to detect a local current or voltage extremum.

It is a further object of this invention to provide and NRD local extremum seeking circuit that can be used to detect a negative going or positive going extremum.

It is a further object of this invention to provide an NRD local extremum seeking circuit that is useful as a radiation hard PVR.

It is a further object of this invention to provide an NRD local extremum seeking circuit with an accuracy that can be arbitrarily small down to the noise level of the NRD.

It is a further object of this invention to provide an NRD local extremum seeking circuit that does not operate in the second stable region of the NRD.

This invention results from the realization that a negative resistance device (NRD) local extremum seeking circuit can be accomplished by applying an excitation signal superimposed on a bias signal to an NRD, detecting the resulting signal and adjusting the detected signal by varying the bias signal to identify a local extremum.

This invention features a negative resistance device local extremum seeking circuit which includes a negative resistance device (NRD), a biasing device for providing a bias signal to operate the NRD, a detector for detecting the output of NRD, and an adjusting circuit responsive to the detector for adjusting the bias signal to operate the NRD at its local extremum or peak. The bias signal at the peak can be used as a stable current or voltage reference depending on the type of NRD it is used with.

Preferably, the biasing device includes an excitation device that may be a dither generator for applying an excitation signal to the NRD. The excitation signal may be superimposed on the bias signal. Typically, the excitation signal is at least two orders of magnitude smaller than the bias signal and has a frequency of between 100 Hz and 1 MHz.

Preferably, the detector includes means for detecting the variation in the output of the NRD due to the excitation signal. The detector may include a buffer amplifier for creating a voltage signal representative of the current output of the NRD. Further included may be a filter for blocking the DC component of this voltage signal.

Typically, the variation in the output of the NRD due to the excitation signal is compared to the excitation signal. This comparing may be accomplished by including a demodulator, which may compare the phase of the detected variation in the output of the NRD to the phase of the dither signal. The output of the detector typically changes depending on whether the compared phases are alike or not. In a preferred embodiment, these outputs are substantially opposite, and the output is a positive voltage signal when the phases are alike and a negative voltage signal when the phases are different. The bias adjust circuit acts to decrease the size of the detector output. Typically, this is accomplished by including a filter for blocking the AC component of the detector output signal and further including a compensation amplifier responsive to the DC component of the filtered signal. The compensation amplifier typically increases the bias signal when the DC component of the combined signal has a first value and decreases the bias signal when the DC component of the combined signal has a second value. Preferably, the bias signal is increased when the input of the compensation amplifier is positive, and decreased when its input is negative.

When the peak of the NRD is a local current extremum, a bias voltage is applied to the NRD. When the peak is a local voltage extremum, a bias current is applied to the NRD. Whether the peak is a positive going peak or a negative going peak, the peak seeker typically includes circuitry for preventing the NRD from operating beyond the negative resistance operating region of the NRD.

A negative resistance device local extremum seeking circuit may also be accomplished by including an NRD, a biasing device for providing a bias signal to operate the NRD, means for providing an excitation signal to the NRD, and means for detecting the variation in the output of the NRD due to the excitation signal. The bias signal is adjusted by a bias adjust circuit, responsive to the detector, that adjusts the bias signal to operate the NRD at the peak with the excitation signal preferably bracketing this peak. Typically, the detector is responsive to the excitation signal and includes means for comparing the phase of the detected variation in the output of the NRD due to the excitation signal to the phase of the excitation signal. The bias signal at the peak can then be used as a stable reference signal.

A negative resistance device local current extremum seeking circuit according to this invention includes an NRD having at least one local current extremum and a biasing device for providing a bias voltage to operate the NRD. Excitation means are included for providing an excitation voltage to the NRD, and a detector circuit detects the phase of the output of the NRD due to the excitation voltage. This detector then compares the phase of the output of the NRD due to the excitation voltage to the phase of the excitation voltage, and a bias adjust circuit responsive to the detector output adjusts the bias voltage to operate the NRD at a local current extremum with the excitation voltage bracketing the extremum. Preferably, the bias voltage at the local current extremum is then used as a stable reference voltage. A low pass filter for filtering the AC component of the bias voltage may be included to provide a stable DC reference voltage.

A negative resistance device local extremum seeking circuit according to this invention may also be accomplished by including an NRD and a biasing device for providing a bias signal to operate the NRD. The phase shift of the NRD due to the bias signal is detected, and the bias signal is adjusted in response to the detected phase shift to operate the NRD at its peak. Preferably, the biasing device includes circuitry for applying an excitation signal to the NRD, and the detector includes a phase comparator for comparing the phase of the excitation signal to the phase of the output of the NRD due to the excitation signal.

DISCLOSURE OF PREFERRED EMBODIMENT

Other objects, features and advantages will occur from the following description of a preferred embodiment and the accompanying drawings, in which.

Figure 1A:
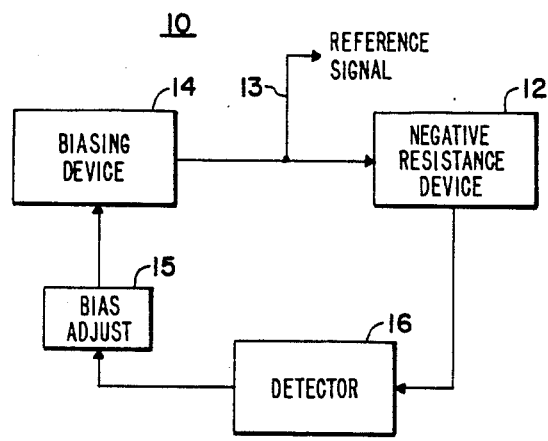
FIG. 1A is a simplified block diagram of an NRD local extremum seeking circuit according to this invention.

A negative resistance device local extremum seeking circuit according to this invention may be accomplished by providing a bias signal to operate a negative resistance device (NRD). The response of the NRD to the bias signal is detected, and the detected signal is adjusted by varying the bias signal to identify a local extremum. The bias signal that operates the NRD at this local extremum is then extracted for use as a stable reference signal. The local extremum seeking circuit is beneficial for detecting both local current and voltage extrema.

Preferably, the bias signal includes an excitation signal, which is preferably a dither signal, which may be superimposed on the bias signal. This dither signal typically has a frequency between 100 Hz and 1 MHz, and may be at least two orders of magnitude smaller than the bias signal at the peak of the NRD.

Typically, the local extremum seeking circuit operates by applying the dither signal superimposed on the bias signal to the NRD and detecting the variation in the output of the NRD due to the dither signal. The detector may include a buffer amplifier for creating a voltage signal representative of the current output of the NRD. The detector also preferably includes a filter for blocking the DC component of the voltage signal created by the buffer amplifier. The output of the DC blocking filter is an AC signal representative of the response of the NRD to the dither signal. This detected response is then compared to the dither signal which was applied to the NRD. Preferably, a phase-sensitive demodulater is used to compare the phase of the detected signal to the phase of the dither signal.

The circuit that compares the dither signal to the response preferably has a first output when the phases are alike and the second output when the phases are different. These outputs are preferably substantially opposite. If a demodulater is used to compare the phase of the detected NRD output to the phase of the dither signal, its output may be a positive voltage signal when the phases are alike, and a negative voltage signal when the phases are different. Preferably, its output is passed through a filter for blocking the AC component of the combined signal. The DC component is then preferably passed to a compensation amplifier that adjusts the bias signal in response to its input.

To establish a stable voltage reference signal, an NRD having at least one local current extremum is chosen. The NRD is then biased with a bias voltage to operate the NRD at its local current extremum. Typically, an NRD has two local current extrema, one a positive going peak and the other a negative going peak. These peaks bracket the negative resistance portion of the I-V curve of the device. Either peak can be employed as a voltage reference with suitable well-known circuit modifications. In each case, the local extremum seeking circuit preferably further includes circuitry for preventing the NRD from operating beyond the negative resistance operating region of the NRD.

Alternatively, the local extremum seeking circuit can be used to establish a stable current reference signal. In this case, an NRD having at least one local voltage extremum is chosen, and the bias signal is a bias current applied to operate the NRD at one of these peaks.

In a preferred embodiment, the NRD is operated at its positive going peak. This peak can be a rounded peak, for example the peak of a tunnel diode, or can be an extremely sharp peak, for example the peak of a single or multiple quantum well super lattice NRD. In either case, a bias voltage is applied to the NRD to operate the NRD near its peak. Typically, the bias voltage is first applied at a point somewhat below the positive going peak. An excitation signal, which is typically a sine wave having an extremely small amplitude approaching the noise level of the NRD, is superimposed on the bias voltage and the combined voltage is applied to the NRD.

The current response of the NRD to this combined signal is detected by a buffer amplifier that converts the detected current to a voltage. This voltage signal is then passed through a DC blocking filter. The blocking filter output is an AC signal representative of the response of the NRD to the dither signal. This response is then amplified by an AC amplifier and passed to a demodulator.

The demodulator compares the detected signal to the dither signal. The demodulator has a positive output when the signals are in phase and a negative output when they are out of phase. This output is then passed to a demodulator filter that filters the AC component of the signal and produces a DC output having a positive, negative or zero value. This filtered signal is then passed to a compensation amplifier. The compensation amplifier alters the bias signal applied to the NRD in response to the filtered demodulator signal. If the demodulator output is positive, the compensation amplifier increases the bias voltage. If the demodulator output is negative, the compensation amplifier decreases the bias voltage. If the demodulator output is null, the compensation amplifier does not change the bias voltage and the NRD is biased at its peak. The output of the compensation amplifier is passed through a clamping circuit that limits the amplitude of the bias voltage to prevent it from going beyond the negative peak of the device.

As a result of this feedback circuit, the negative resistance device local extremum seeking circuit adjusts the bias voltage applied to the NRD in response to the phase shift caused by the NRD. Since the device is operating around a positive going peak, if the bias voltage is below the peak, the NRD does not shift the phase of the dither signal and the compensation amplifier thus increases the bias voltage to move it toward the peak. If the bias voltage is above the peak, the phase is shifted 180 degrees and the compensation amplifier decreases the bias voltage to move it toward the peak. If the bias voltage is operating at the peak, the phase is shifted half of the time and the compensation amplifier does not alter the bias voltage, thereby maintaining the operation of the NRD at its peak. Thus, the local extremum seeking circuit automatically seeks the peak, and holds the operation of the NRD at its peak.

There is shown in FIG. 1A a negative resistance device (NRD) local extremum seeking circuit 10 according to this invention including a biasing device 14 for supplying a bias signal to negative resistance device 12. The bias signal supplied to NRD 12 by biasing device 14 is adjusted by bias adjust 15. Bias adjust 15 is responsive to detector 16, which detects the response of NRD 12 to the bias signal from biasing device 14. The bias signal is sampled over line 13 as a reference signal. Local extremum seeking circuit 10 automatically detects a local current or voltage extremum of NRD 12 and operates the NRD at this point. Because local extremum seeking circuit 10 operates at a local extremum, it can be used as a stable voltage or current reference device.

Figure 1B:
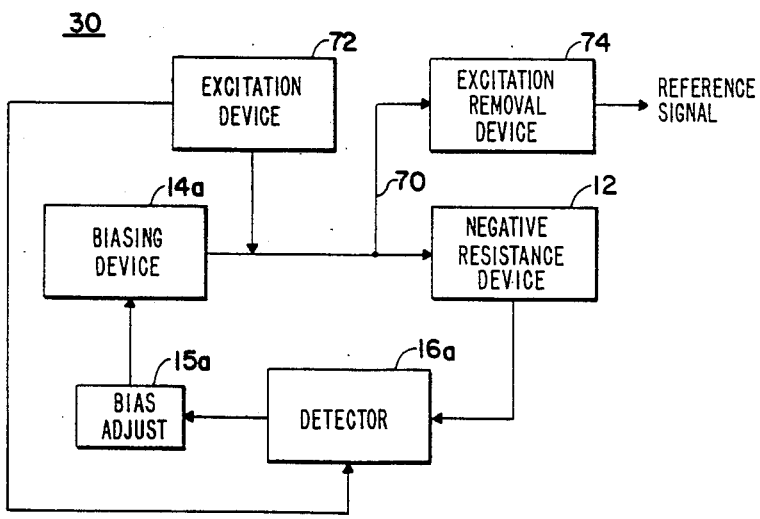
FIG. 1B is a block diagram of an alternative NRD local extremum seeking circuit according to this invention.

Negative resistance device local extremum seeking circuit 30, FIG. 1B, includes detector 16a that detects the response of NRD 12 to the bias signal from biasing device 14a and the excitation signal from excitation device 72. Detector 16a is also responsive to excitation device 72, and typically compares a reference signal related to the excitation signal to the response of NRD 12 to the excitation signal. Detector 16a then determines where the bias signal is in relation to the local extremum or peak, and causes bias adjust 15a to alter the bias signal from biasing device 14a to move it toward the peak. The combined bias and excitation signals are sampled over line 70, and the excitation signal is removed by device 74 to produce a stable voltage or current reference signal.

Figure 2:
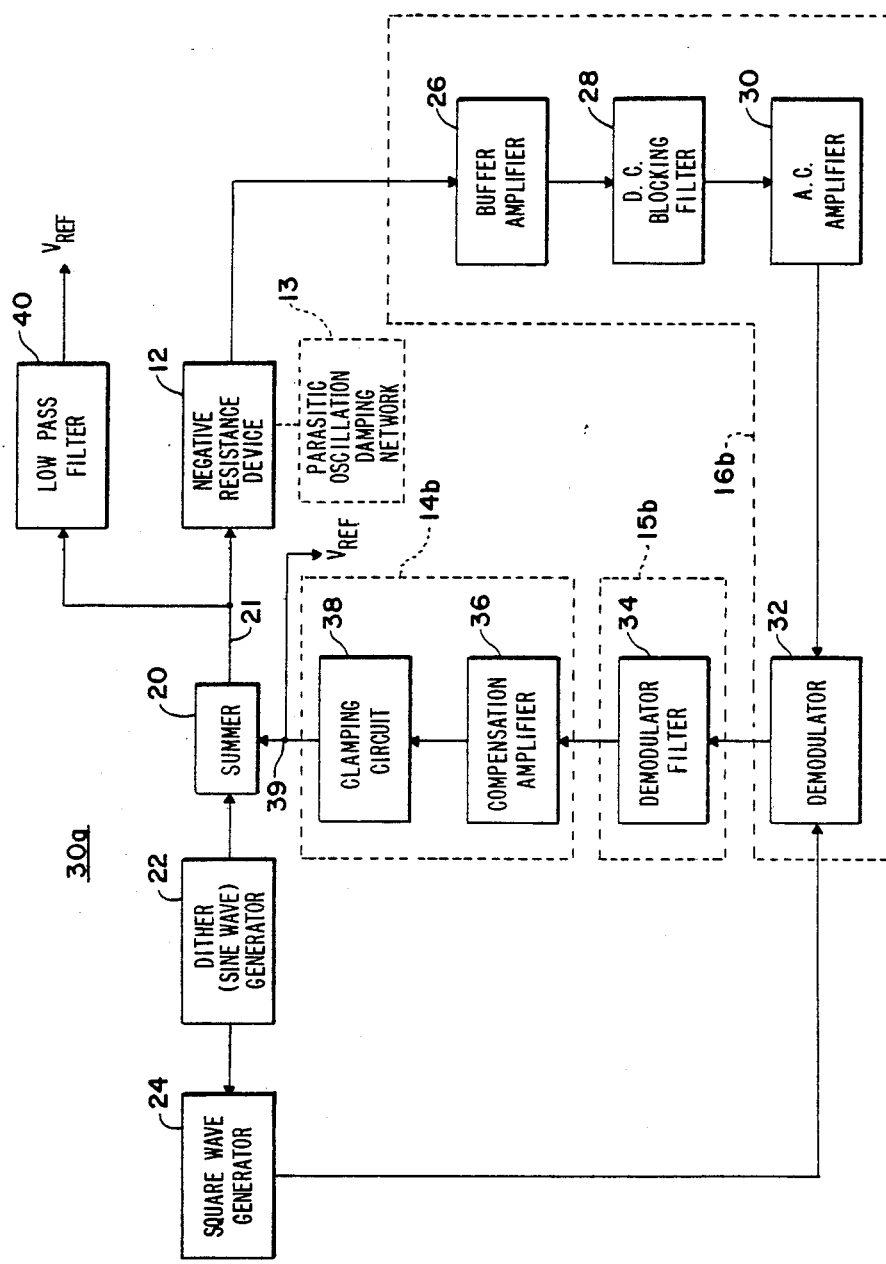
FIG. 2 is a detailed block diagram of the NRD local extremum seeking circuit of FIG. 1B.

Negative resistance device local extremum seeking circuit 30a, FIG. 2, detects a local current or voltage extremum of negative resistance device 12. Although the local extremum seeking circuit according to this invention can be used to detect either a positive going or negative going voltage or current extremum of a negative resistance device, for clarity of description local extremum seeking circuit 30a will be described as seeking the positive going local current extremum of NRD 12.

NRD 12 is biased with a bias voltage from biasing device 14b, shown in phantom. Since the approximate position of the peak being sought is known, a beginning bias voltage is chosen to be somewhere near this peak or operating point. The bias voltage from biasing device 14b is summed with a dither or sine wave signal from dither generator 22. The dither voltage from dither generator 22 is an extremely small sine wave which is typically at least two orders of magnitude smaller than the voltage at the operating point of NRD 12. For a quantum well NRD having an operating point of approximately 1 volt, a typical dither voltage is a sine wave with a frequency of between 100 Hz and 1 MHz and a peak to peak amplitude of 200 microvolts.

The amplitude of the dither signal affects the accuracy of the peak seeker. A very large dither signal will result in a bias signal that has a large uncertainty. This will cause reference voltage $V_{ref}$ to have a larger drift uncertainty. A very small dither signal will produce a small signal from the demodulator that may be swamped by electrical noise. This will also cause an uncertainty in $V_{ref}$. Thus, the selection of the dither voltage magnitude within certain broad limits will indirectly affect the stability of $V_{ref}$.

The frequency of the dither signal affects the speed of response of the bias adjust circuit and, thus, affects the speed at which $V_{ref}$ recovers from disturbances. Disturbances are common in the military electronics environment. The higher the frequency of the dither, the quicker the response speed; the lower the dither frequency, the lower the response speed. There is an upper limit on dither frequency which is set by the availability of high speed military amplifiers and demodulators. This limit is continually increasing as technology improves. The lower limit of the dither frequency is set by the amount of disturbance recovery time which is available and varies with the overall system requirements.

The combined bias and dither signals from summer 20 are passed over line 21 to NRD 12. This combined signal is a DC signal of approximately 1 volt with a 200 microvolt dither signal superimposed on it. The response of NRD 12 to this signal is detected by detector 16b, shown in phantom. Detector 16b includes buffer amplifier 26, DC blocking filter 28, and AC amplifier 30. The current from NRD 12 enters buffer amplifier 26, which then generates a voltage signal in response. This voltage signal is a DC signal with a superimposed AC signal that is representative of the current from NRD 12. This voltage signal then enters DC blocking filter 28, which passes only the AC portion of the combined voltage signal. This AC signal is then amplified by amplifier 30.

The amplified signal is then passed to demodulator 32, which is also responsive to square wave generator 24. Square wave generator 24 converts the dither signal from dither generator 22 to a square wave of much greater amplitude. The signal supplied to demodulator 32 from square wave generator 24 is typically a five volt square wave that is in phase with the dither signal. Demodulator 32 compares the phase of the square wave to the phase of the response of the NRD to the dither signal generated by amplifier 30. If these two signals are in phase, demodulator 32 outputs a positive signal, and if they are out of phase, it outputs a negative signal.

The demodulator output is passed through bias adjust circuit 15b, shown in phantom, that includes demodulator filter 34, which blocks the AC component of this signal and generates a DC signal with a positive, negative or null value. This signal is then passed to biasing device 14b.

Biasing device 14b, shown in phantom, includes compensation amplifier 36 and clamping circuit 38. Compensation amplifier 36 is constantly outputting a DC signal which acts as the bias signal for NRD 12. Compensation amplifier 36 responds to the filtered demodulator signal from bias adjust circuit 15b as follows. If the signal from bias adjust circuit 15b is positive, compensation amplifier 36 increases the amplitude of the DC bias signal. If the output of bias adjust circuit 15b is negative, compensation amplifier 36 decreases the amplitude of the bias signal. If there is a null output from bias adjust 15b, compensation amplifier 36 does not change the amplitude of the bias signal. Clamping circuit 38 is preset to limit the amplitude of the bias voltage to keep NRD 12 from operating beyond the negative going peak of the I-V curve for NRD 12. This keeps operation close to the desired peak operating point and also prevents the device from moving beyond the negative going peak and running away up the positively sloped "second stable operating region" of NRD 12.

As a result of this feedback loop, negative resistance device local extremum seeking circuit 30a automatically seeks the positive going local current extremum of negative resistance device 12 and operates NRD 12 at this point. Because local extremum seeking circuit 30a operates NRD 12 at a point arbitrarily close to its peak, the device is extremely stable. This then provides a stable voltage reference that can be held to within about plus or minus 100 parts per million of the peak voltage. The bias voltage can be sampled at point 39 at the output of biasing device 14b or at the output of summer 20. If the voltage is sampled from line 21, low pass filter 40 is included to filter the dither signal from the bias voltage and pass only the stable DC voltage signal.

It is a characteristic of most but not all NRDs that when they are operated in their negative resistance regions they may undergo parasitic oscillations at very high frequencies. These oscillations would normally prevent the NRD from operating in this circuit. Thus, damping circuits such as parasitic oscillation damping network 13, shown in phantom, which may be in parallel or in series with the NRD are used for most NRDs to prevent these oscillations. These damping circuits do not affect the operation of this extremum seeking circuit but are shown for completness. Typically, for tunnel diodes a single capacitor in parallel with the NRD is adequate as a parasitic oscillation damping network.

Figure 3A:
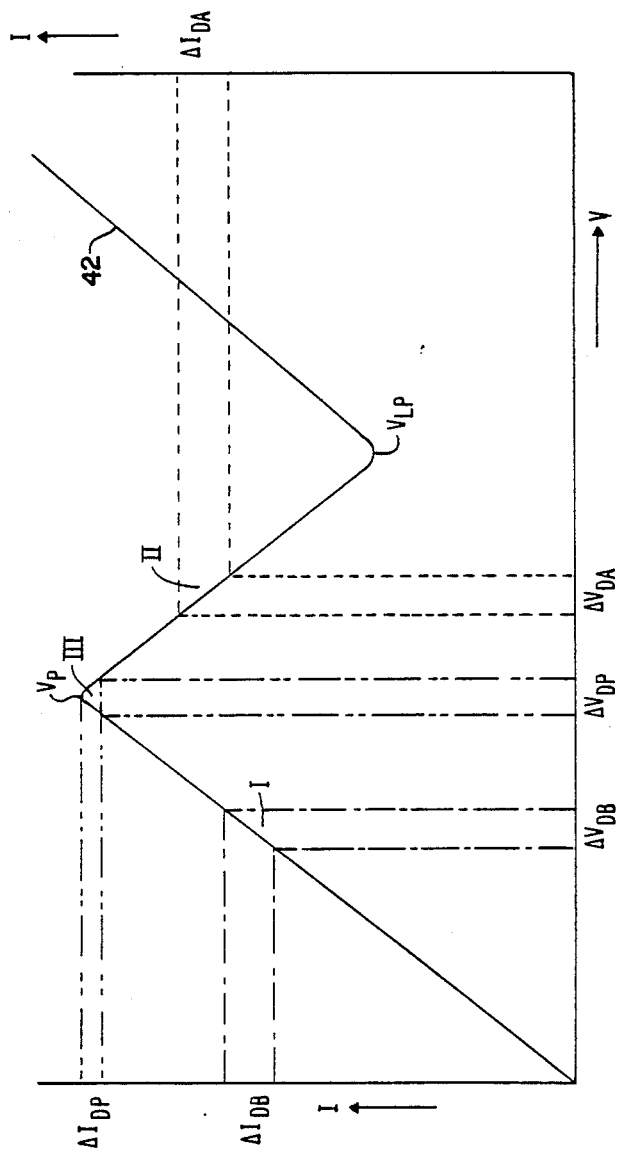
FIG. 3A is a simplified I-V curve for an NRD showing a dither signal above, below and at a local current extremum.

An I-V curve for a quantum well super lattice negative resistance device is shown in FIG. 3A. Curve 42 represents the current response to changes in voltage applied to a quantum well super lattice NRD. Three operating regions of this NRD have been chosen to illustrate the operation of the negative resistance device local extremum seeking circuit according to this invention. Region I is a region below positive going peak $V_P$. The current response to voltage delta $V_{DB}$ is delta $I_{DB}$. Region II is beyond the positive going peak $V_P$. The response of the NRD to voltage delta $V_{DA}$ is delta $I_{DA}$. Finally, region III is chosen at peak $V_P$. The current response in this case is designated as delta $I_{DP}$.

Figure 3B:
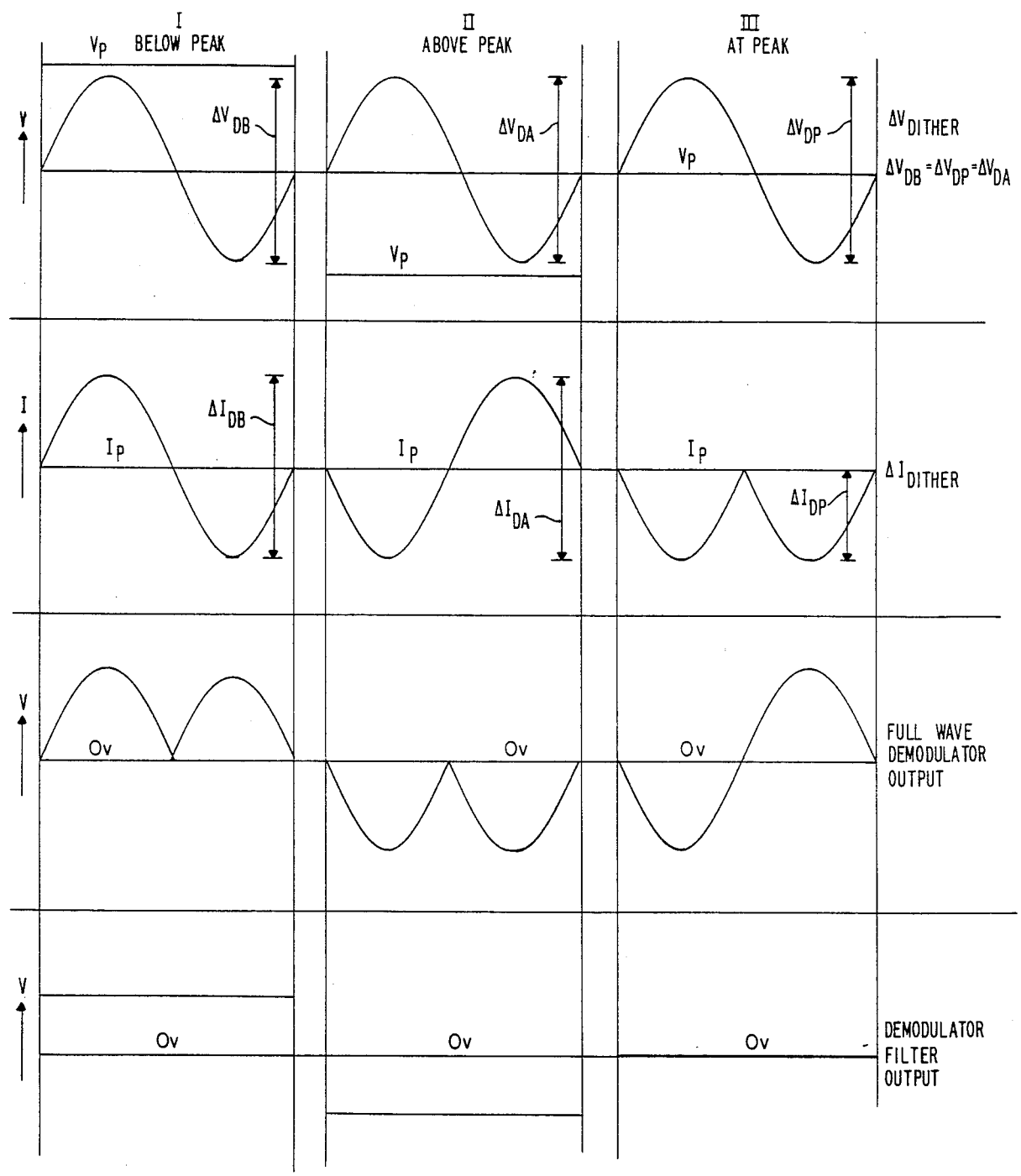
FIG. 3B is a simplified graph of the response of the NRD, demodulator and demodulator filter of FIG. 2 to the dither signal of FIG. 3A.

The operation of negative resistance device local extremum seeking circuit 30, FIG. 2, in regions I, II, and III of FIG. 3A is shown in FIG. 3B. Column I corresponds to region I, Column II to region II, and Column III to region III. A sine wave dither signal delta $V_{Dither}$ is chosen having an amplitude of delta $V_{DB}$. This amplitude is constant for the three operating regions described herein. The response of the quantum well super lattice NRD to the dither voltage is depicted by delta $I_{Dither}$. In region I, the response of the NRD to the dither voltage is in phase with the dither voltage. As the voltage increases, the current from the NRD also increases. As the voltage decreases, the current output decreases. In region II, the response of the NRD to the dither voltage is the opposite of the response in region I. Because the slope of the curve is negative in region II, as the dither voltage increases the current decreases, and as the dither voltage decreases the current increases. In region III at the peak or operating point of the NRD, the response of the NRD to either increasing or decreasing voltage is a decreased current. Thus, the response is out of phase when the voltage goes up and in phase when the voltage goes down. The delta $I_{Dither}$ shown in FIG. 3B is equivalent to the output from DC blocking filter 28, FIG. 2. The output of amplifier 30 is this signal amplified to have a maximum value of approximately 5 volts.

Full wave demodulator 32, FIG. 2, is responsive to this amplified delta $I_{Dither}$ signal and is also responsive to the square wave from square wave generator 24. This square wave is always in phase with the dither signal. The output of full wave demodulator 32 is shown in FIG. 3B. When the response of the NRD to the dither signal is in phase with the dither signal, the output of full wave demodulator 32 is a positive voltage signal. When the signals are out of phase, the output is a negative voltage signal. In region I, the dither signal and the response of the NRD to the dither signal are always in phase. Thus, full wave demodulator 32 outputs a positive voltage signal. In region II, the signals are always out of phase and demodulator 32 outputs a negative voltage signal. In region III at the operating point or peak of the NRD, the signals are out of phase half the time and in phase half the time and the demodulator output is negative half the time and positive half the time.

After the AC component of the full wave demodulator output is filtered by demodulator filter 34, FIG. 2, the resulting signal is a DC voltage having a positive, negative, or null value. In region I, this voltage is positive, in region II it is negative, and in region III it is zero. Compensation amplifier 36, FIG. 2, increases the amplitude of the bias voltage in response to a positive voltage input and decreases the amplitude of the bias voltage in response to a negative voltage input. Thus, in region I below the operating point of the NRD, bias adjust circuit 15b, FIG. 2, causes the bias voltage to increase towards peak voltage $V_p$. In region II beyond the peak, bias adjust circuit 15b causes the bias voltage to decrease and move toward peak voltage $V_p$. At the peak or operating point, bias adjust circuit 15b keeps the bias voltage at the operating point $V_p$. Clamping circuit 38, FIG. 2, prevents the bias voltage from going beyond negative going peak $V_{1p}$, FIG. 3A. By preventing the negative resistance device local extremum seeking circuit from operating beyond this point, the local extremum seeking circuit will always seek and hold the bias voltage at the operating point $V_p$.

Figure 4A:
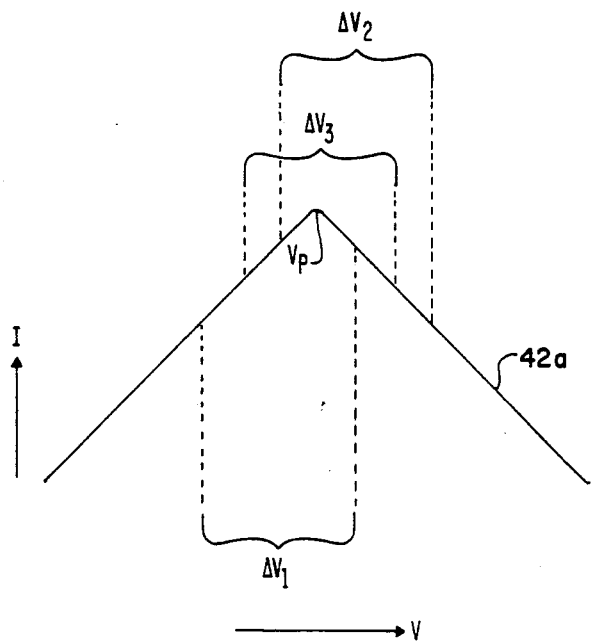
FIG. 4A is an enlarged view of the positive going peak of the I-V curve of FIG. 3A.
Figure 4B:
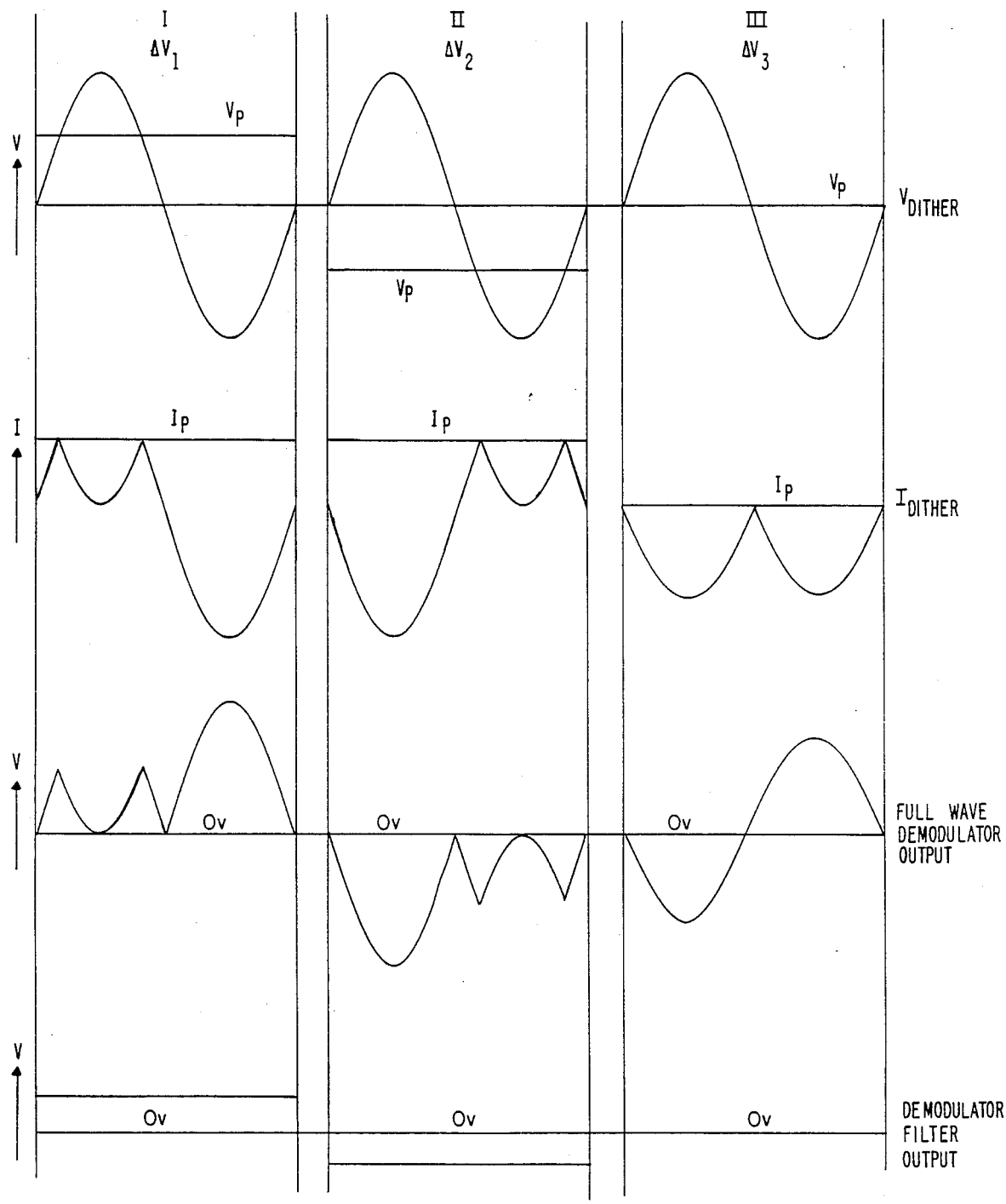
FIG. 4B is a simplified graph of the response of the NRD, demodulator and demodulator filter of FIG. 2 to the dither signal of FIG. 4A.

The response of an NRD to dither voltages at and very close to peak $V_p$ is shown in FIGS. 4A and 4B. I-V curve 42a is an enlarged view around positive going peak $V_p$. Delta $V_1$ is a dither voltage bracketing peak $V_p$ centered slightly below the peak. Dither voltage delta $V_2$ brackets the peak but is centered slightly above the peak, and dither voltage $V_3$ brackets the peak and is centered on the peak.

The response of negative resistance device local extremum seeking circuit 30a, FIG. 2, to the dither voltages of FIG. 4A is shown in FIG. 4B. Column I corresponds to operation just below peak $V_p$. Column II corresponds to operation just above peak $V_p$, and column III corresponds to operation at peak $V_p$.

$I_{Dither}$ represents the response of the NRD to the dither voltage. In region delta $V_1$ just below the peak, as the dither voltage increases toward the peak the NRD current output increases. When the voltage reaches and goes beyond the peak, the current begins to decrease. After the voltage reaches its maximum value and begins to decrease, the current again increases until it traverses the peak. At this point, as the voltage decreases, the current also decreases until the lowest voltage is reached. At this point, as the voltage increases the current also increases until the voltage reaches its starting point and the cycle repeats itself.

In region delta $V_2$ just above the peak, the response of the NRD to the dither voltage is substantially the opposite of the response in region delta $V_1$. In region delta $V_3$, with the dither voltage starting at peak voltage $V_P$, the response of the NRD to the voltage is always a current at or below the peak current $I_p$.

The full wave demodulator output in region delta $V_1$ is a positive voltage, but its filtered amplitude is less than the amplitude of the response in region I, FIG. 3A. Thus, compensation amplifier 36, FIG. 2, only slightly increases the bias voltage. As a result, as the bias voltage approaches peak $V_P$, it increases more and more slowly, and eventually reaches the peak. At the peak, the bias voltage is stable. Just above the peak, the filtered demodulator output is slightly negative and the compensation amplifier slowly decreases the bias voltage to move it toward the peak.

Negative resistance device local extremum seeking circuit 30a, FIG. 2, thus seeks the positive going local current extremum of the NRD and holds the bias voltage steady when it reaches peak value $V_P$. For an NRD having a non-symmetric curve around operating point $V_P$, the negative resistance device local extremum seeking circuit will be continually adjusting the bias voltage even at the peak. If the curve is non-symmetric, the filtered full wave demodulator output will not be exactly nulled at the peak. Thus, the bias voltage will be continuously adjusted around peak $V_P$. Although this causes a slight variation in the bias voltage, and thus a slight variation in the value of the voltage reference, this variation is extremely small and may approach the noise level of the device. Thus, for all practical purposes the negative resistance device local extremum seeking circuit can be used as a stable voltage reference device in conjunction with virtually any NRD.

Figure 5:
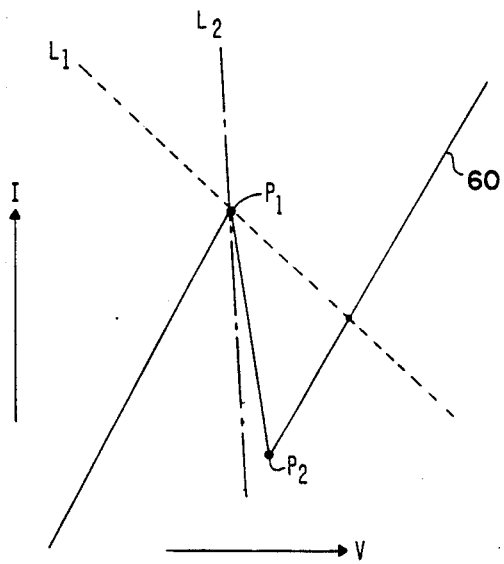
FIG. 5 is a simplified I-V curve for a quantum well NRD showing the load line of the local extremum seeking circuit of FIG. 2.

FIG. 5 depicts a portion of an I-V curve for a multiple quantum well super lattice negative resistance device. Curve 60 has extremely sharp positive going peak $P_1$ and extremely sharp negative going peak $P_2$. The negative resistance portion of the curve between peaks $P_1$ and $P_2$ is almost vertical. Because the negative resistance device local extremum seeking circuit described above can be designed to have an almost arbitrarily small uncertainty and almost any desired response time, the local extremum seeking circuit can be used even with a multiple quantum well super lattice NRD having the characteristics shown in FIG. 5.

Another advantage of the negative resistance device peak seeker described above is that the load line $L_2$ of the device is such that the device operates at peak $P_1$ and will not "jump" to its second stable operating region beyond peak $P_2$. Typically, circuits for operating negative resistance devices have load lines as shown by line $L_1$. These circuits are designed to operate the NRD in its two stable regions. Thus, when the voltage reaches peak value $P_1$, it will "jump" along load line $L_1$ to the second stable operating region beyond peak $P_2$. This "jumpin" characteristic makes the device useful as a switch or detector.

In contrast, the negative resistance device local extremum seeking circuit according to this invention has a load line $L_1$ and operates below peak $P_2$. Since the local extremum seeking circuit is stable around peak $P_1$, it will not "jump" to the second "stable" operating region above peak $P_2$, but instead will always operate around positive going peak $P_1$. Thus, the negative resistance device local extremum seeking circuit according to this invention is ideally suited for operating an NRD at its peak to allow the NRD to be used as a stable voltage reference.

Although specific features of the invention are shown in some drawings and not others, this is for convenience only as each feature may be combined with any or all of the other features in accordance with the invention.

Other embodiments will occur to those skilled in the art and are with the following claims:

What is claimed is:

1. A negative resistance device local current extremum seeking circuit comprising:
   a negative resistance device (NRD) having at least one local current extremum;
   biasing means for providing a bias voltage to operate said NRD;
   excitation means for providing a dither voltage to said NRD;
   means for detecting the variation in the output of said NRD due to said dither voltage;
   means for comparing the detected variation in the output of said NRD due to said dither voltage to the dither voltage; and
   means, responsive to said means for comparing, for adjusting said bias voltage to operate said NRD at said local current extremum with the dither voltage bracketing said extremum.

2. The negative resistance device local current extremum seeking circuit of claim 1 in which said means for comparing compares the phase of the output of the NRD due to said dither voltage to the phase of said dither voltage.

3. The negative resistance device local current extremum seeking circuit of claim 1 further including means for sensing said bias voltage as a reference voltage.

4. The negative resistance device local current extremum seeking circuit of claim 3 in which said means for sensing includes a low pass filter for filtering the AC component of said bias voltage.

5. A negative resistance device local extremum seeking circuit comprising:
   a negative resistance device (NRD);
   biasing means for providing a bias signal to operate said NRD;
   means for detecting the output of said NRD; and
   means, responsive to said means for detecting, for adjusting said bias signal to operate said NRD at a local extremum.

6. The negative resistance device local extremum seeking circuit of claim 5 further including means for sensing said bias signal as a reference signal.

7. The negative resistance device local extremum seeking circuit of claim 5 in which the peak of said NRD is a local current extremum.

8. The negative resistance device local extremum seeking circuit of claim 7 in which said means for biasing provides a bias voltage to said NRD.

9. The negative resistance device local extremum seeking circuit of claim 5 in which the peak of said NRD is a local voltage extremum.

10. The negative resistance device local extremum seeking circuit of claim 9 in which said means for biasing provides a bias current to said NRD.

11. The negative resistance device local extremum seeking circuit of claim 5 in which said peak is a positive going peak.

12. The negative resistance device local extremum seeking circuit of claim 11 further including means for preventing said NRD from operating beyond the negative resistance operating region of said NRD.

13. The negative resistance device local extremum seeking circuit of claim 5 in which said peak is a negative going peak.

14. The negative resistance device local extremum seeking circuit of claim 13 further including means for preventing said NRD from operating beyond the negative resistance operating region of said NRD.

15. The negative resistance device local extremum seeking circuit of claim 5 in which said biasing means includes means for applying an excitation signal to said NRD.

16. The negative resistance device local extremum seeking circuit of claim 15 in which said means for detecting is responsive to said excitation signal.

17. The negative resistance device local extremum seeking circuit of claim 15 further including means for superimposing said excitation signal on said bias signal.

18. The negative resistance device local extremum seeking circuit of claim 7 in which said excitation signal is at least two orders of magnitude smaller than the bias signal at the peak of the NRD.

19. The negative resistance device local extremum seeking circuit of claim 15 in which the frequency of said excitation signal is between 100 Hz and 1 MHz.

20. The negative resistance device local extremum seeking circuit of claim 15 in which said excitation signal is a dither signal.

21. The negative resistance device local extremum seeking circuit of claim 15 in which said means for detecting the output of said NRD includes means for detecting the variation in the output of said NRD due to said excitation signal.

22. The negative resistance device local extremum seeking circuit of claim 21 in which said means for detecting the variation in the output of said NRD due to said excitation signal includes a buffer amplifier for creating a voltage signal representative of the current output of said NRD.

23. The negative resistance device local extremum seeking circuit of claim 22 in which said means for detecting the variation in the output of said NRD due to said excitation signal further includes a filter for blocking the DC component of the voltage signal created by said buffer amplifier.

24. The negative resistance device local extremum seeking circuit of claim 21 in which said means for detecting the variation in the output of said NRD due to said excitation signal includes a filter for blocking the DC component of the output of said NRD.

25. The negative resistance device local extremum seeking circuit of claim 21 in which said means for detecting the output of said NRD further includes means for comparing said excitation signal to the detected variation in the output of said NRD due to said excitation signal.

26. The negative resistance device local extremum seeking circuit of claim 25 in which said means for comparing includes a demodulator.

27. The negative resistance device local extremum seeking of claim 25 in which said means for adjusting said bias signal is responsive to said means for comparing.

28. The negative resistance device local extremum seeking circuit of claim 27 in which said means for comparing compares the phase of the detected variation in the output of said NRD to the phase of said excitation signal.

29. The negative resistance device local extremum seeking circuit of claim 28 in which said means for comparing has a first output when the two compared phases are alike and a second output when the two compared phases are different.

30. The negative resistance device local extremum seeking circuit of claim 29 in which said second output is substantially the opposite of said first output.

31. The negative resistance device local extremum seeking circuit of claim 29 in which said first output is a positive voltage signal and said second output is a negative voltage signal.

32. The negative resistance device local extremum seeking circuit of claim 29 in which said means for adjusting said bias signal includes means for combining the outputs of said means for comparing to produce a combined signal.

33. The negative resistance device local extremum seeking circuit of claim 32 in which said means for adjusting said bias signal further includes means for decreasing the amplitude of said combined signal.

34. The negative resistance device local extremum seeking circuit of claim 32 in which said means for combining includes a filter for blocking the AC component of said combined signal.

35. The negative resistance device local extremum seeking circuit of claim 34 in which said means for adjusting said bias signal further includes a compensation amplifier responsive to the DC component of said combined signal.

36. The negative resistance device local extremum seeking circuit of claim 35 in which said compensation amplifier increases said bias signal when the DC component of said combined signal has a first value and decreases said bias signal when the DC component of said combined signal has a second value.

37. The negative resistance device local extremum seeking circuit of claim 36 in which said first value is positive and said second value is negative.

38. A negative resistance device local extremum seeking circuit comprising:
a negative resistance device (NRD);
biasing means for providing a bias signal to operate said NRD;
means for providing an excitation signal to said NRD;
means for detecting the variation in the output of said NRD due to said excitation signal; and
means, responsive to said means for detecting, for adjusting said bias signal to operate said NRD at its peak with the excitation signal bracketing said peak.

39. The negative resistance device local extremum seeking circuit of claim 38 in which said means for detecting includes means for comparing the phase of said excitation signal to the phase of the detected variation in the output of said NRD due to said excitation signal.

40. The negative resistance device local extremum seeking circuit of claim 38 further including means for sensing said bias signal as a reference signal.

41. The negative resistance device local extremum seeking circuit of claim 38 in which said means for detecting is responsive to said means for providing an excitation signal.

42. A negative resistance device local extremum seeking circuit comprising:
a negative resistance device (NRD);
biasing means for providing a bias signal to operate said NRD;
means for detecting the phase shift of said bias signal due to said NRD, and
means for adjusting said bias signal in response to the detected phase shift to operate said NRD at its local extremum.

43. The negative resistance device local extremum seeking circuit of claim 42 further including means for sensing said bias signal as a reference signal.

44. The negative resistance device local extremum seeking circuit of claim 42 in which said biasing means includes means for applying an excitation signal to said NRD.

45. The negative resistance device local extremum seeking circuit of claim 44 in which said means for detecting includes means for comparing the phase of said excitation signal to the phase of the output of said NRD due to said excitation signal.

46. A negative resistance device local extremum seeking circuit comprising:
a negative resistance device;
biasing means for providing a bias signal to operate said NRD;
means for providing an excitation signal to said NRD;
means, responsive to said means for providing an excitation signal, for detecting the variation in the output of said NRD due to said excitation signal; and
means, responsive to said means for detecting, for adjusting said bias signal to operate said NRD at a local extremum.

* * * * *